(12) United States Patent
Xu et al.

(10) Patent No.: US 11,817,463 B2
(45) Date of Patent: Nov. 14, 2023

(54) DRIVING BACKPLANE AND METHOD FOR MANUFACTURING THE SAME, AND DISPLAY DEVICE

(71) Applicants: Hefei Xinsheng Optoelectronics Technology Co., Ltd., Anhui (CN); BOE Technology Group Co., Ltd, Beijing (CN)

(72) Inventors: Wenjie Xu, Beijing (CN); Jing Wang, Beijing (CN); Xiaodong Xie, Beijing (CN); Tsungchieh Kuo, Beijing (CN); Weiwei Chu, Beijing (CN); Yuan Li, Beijing (CN)

(73) Assignees: HEFEI XINSHENG OPTOELECTRONICS TECHNOLOGY CO., LTD., Anhui (CN); BOE TECHNOLOGY. GROUP CO., LTD., Beijing (CN)

( * ) Notice: Subject to any disclaimer, the term of this patent is extended or adjusted under 35 U.S.C. 154(b) by 334 days.

(21) Appl. No.: 17/213,939

(22) Filed: Mar. 26, 2021

(65) Prior Publication Data
US 2022/0068980 A1 Mar. 3, 2022

(30) Foreign Application Priority Data
Aug. 25, 2020 (CN) .......................... 202010867200.2

(51) Int. Cl.
*H01L 27/12* (2006.01)
*H01L 25/16* (2023.01)
(Continued)

(52) U.S. Cl.
CPC ...... *H01L 27/1288* (2013.01); *H01L 25/0753* (2013.01); *H01L 25/167* (2013.01); *H01L 25/50* (2013.01); *H01L 27/153* (2013.01)

(58) Field of Classification Search
CPC ...................................................... H01L 25/50
See application file for complete search history.

(56) References Cited

U.S. PATENT DOCUMENTS

| 2020/0161280 A1* | 5/2020 | Heo | ..................... H01L 25/0753 |
| 2020/0176656 A1* | 6/2020 | Bae | ..................... H01L 33/0095 |

(Continued)

FOREIGN PATENT DOCUMENTS

WO WO-2020116732 A1 * 6/2020 ......... H01L 21/0337

*Primary Examiner* — Paisley L Wilson
(74) *Attorney, Agent, or Firm* — Nath, Goldberg & Meyer; Joshua B. Goldberg

(57) ABSTRACT

Provided are a driving backplane and a method for manufacturing the same, a display device. The method includes: forming a first conductive pattern including signal lines; forming an insulating layer having via holes; forming a second conductive pattern including pairs of coupling electrodes; sequentially forming an inorganic material layer and an organic material layer; performing step exposure and developing on the organic material layer to form an intermediate pattern including a hollow-out portion, a completely-reserved portion and a half-reserved portion; the completely-reserved portion is thicker than the half-reserved portion, a thickness of the half-reserved portion is x times that of the inorganic material layer; etching the inorganic material layer and the intermediate pattern until a part of the inorganic material layer, corresponding to the hollow-out portion, is removed; an etching selection ratio of the inorganic material layer to the intermediate pattern is 1:y, 0<x≤y.

16 Claims, 5 Drawing Sheets

(51) Int. Cl.
 *H01L 27/15* (2006.01)
 *H01L 25/00* (2006.01)
 *H01L 25/075* (2006.01)

(56) References Cited

U.S. PATENT DOCUMENTS

2022/0068980 A1* 3/2022 Xu ........................ H01L 25/167
2022/0375990 A1* 11/2022 Im ........................ G09G 3/3233

* cited by examiner (--Prior Art--)

(--Prior Art--)

(--Prior Art--)

(--Prior Art--)

(--Prior Art--)

(--Prior Art--)

DRIVING BACKPLANE AND METHOD FOR MANUFACTURING THE SAME, AND DISPLAY DEVICE

CROSS REFERENCE TO RELATED APPLICATIONS

This application claims priority to Chinese patent application No. 202010867200.2 filed at the Chinese Intellectual Property Office on Aug. 25, 2020, the disclosure of which is incorporated herein by reference in its entirety.

TECHNICAL FIELD

The present disclosure relates to the field of display technology, and in particular to a driving backplane, a method for manufacturing the same and a display device.

BACKGROUND

Mini light emitting diodes (Mini LEDs) have advantages of being light and thin, capable of realizing high contrast, and the like, and thus they have been widely used as a backlight or used for a display panel. In a Mini LED backlight and a Mini LED display panel, a die bonding process is required to fix a Mini LED chip on a driving backplane, and during fixing, the Mini LED chip is generally transferred to the driving backplane by using a transfer device and fixed.

DISCLOSURE OF DISCLOSURE

An embodiment of the present disclosure provides a method for manufacturing a driving backplane, including:
forming a first conductive pattern on a surface of a base substrate, the first conductive pattern includes a plurality of signal lines;
forming an insulating layer with a plurality of via holes therein on the base substrate on which the first conductive pattern is formed;
forming a second conductive pattern on the base substrate on which the insulating layer is formed, the second conductive pattern includes a plurality of pairs of coupling electrodes, each pair of coupling electrodes being respectively used for coupling two electrodes of a light emitting device; each signal line is coupled to at least one of the coupling electrodes through the via hole in the insulating layer;
sequentially forming an inorganic material layer and an organic material layer on the base substrate on which the second conductive pattern is formed;
performing a step exposure and development on the organic material layer to form an intermediate pattern; the intermediate pattern includes a hollow-out portion, a completely-reserved portion and a half-reserved portion, and an orthographic projection of the half-reserved portion on the base substrate covers a spacing region between the pair of two coupling electrodes; an orthographic projection of the hollow-out portion on the base substrate covers at least a part of the coupling electrode; a thickness of the completely-reserved portion is greater than that of the half-reserved portion, and the thickness of the half-reserved portion is x times a thickness of the inorganic material layer;
etching the inorganic material layer and the intermediate pattern until a portion of the inorganic material layer, corresponding to an area where the hollow-out portion is located, is removed; during the etching, an etching selection ratio of the inorganic material layer to the intermediate pattern is 1:y, where 0<x≤y.

In some implementations, 0.7≤x≤0.9, and 3≤y≤5.

In some implementations, the method further includes:
after the etching the inorganic material layer and the intermediate pattern, etching inorganic material reserved in a region where the half-reserved portion is located to remove the reserved inorganic material.

In some implementations, an etching time for etching the inorganic material reserved in the region where the half-reserved portion is located is t1, and an etching time for etching the inorganic material layer and the intermediate pattern is t2, where 0.8*t2*x/y≤t1≤1.1*t2*x/y.

In some implementations, an initial thickness of the completely-reserved portion is 15 to 60 times an initial thickness of the inorganic material layer.

In some implementations, a dry etching method is used for etching the inorganic material layer and the intermediate pattern.

In some implementations, the insulating layer includes a first insulating sublayer and a second insulating sublayer, the first insulating sublayer is located between the second insulating sublayer and the base substrate and the first conductive pattern, the first insulating sublayer is made of an inorganic material, and the second insulating sublayer is made of an organic material.

An embodiment of the present disclosure further provides a driving backplane, including:
a base substrate;
a first conductive pattern located on the base substrate, where the first conductive pattern includes a plurality of signal lines;
an insulating layer located on a side, away from the base substrate, of the first conductive pattern and the base substrate, where the insulating layer has a plurality of via holes therein;
a second conductive pattern located on a side, away from the base substrate, of the insulating layer, the second conductive pattern includes a plurality of pairs of coupling electrodes, and the coupling electrodes in each pair are respectively coupled to two electrodes of a light emitting device; each signal line is coupled with at least one coupling electrode through the via hole in the insulating layer;
an inorganic material layer located on a side of the second conductive pattern away from the base substrate and a side of the insulating layer away from the base substrate;
an organic material layer located on a side of the inorganic material layer away from the base substrate;
where the organic material layer and the inorganic material layer both expose at least a portion of the coupling electrode, and an orthographic projection of the organic material layer on the base substrate does not overlap a spacing region between the pair of two coupling electrodes.

In some implementations, the inorganic material layer exposes the spacing region between the pair of two coupling electrodes In some implementations, the insulating layer includes a first insulating sublayer and a second insulating sublayer, the first insulating sublayer is located between the second insulating sublayer and the base substrate, the first insulating sublayer is made of an inorganic material, and the second insulating sublayer is made of an organic material.

An embodiment of the present disclosure further provides a display device, including: a plurality of light emitting devices and the driving backplane described above, where two electrodes of each of the light emitting devices are coupled to two coupling electrodes in a pair, respectively.

DRAWINGS

The drawings are used to provide a further understanding of the present disclosure, and form a part of the description, and are used together with the following specific embodiments to explain the present disclosure, but do not constitute a limitation on the present disclosure. In the drawings.

DETAILED DESCRIPTION

To make the objects, technical solutions and advantages of the embodiments of the present disclosure more apparent, the technical solutions of the embodiments of the present disclosure will be clearly and completely described below with reference to the drawings of the embodiments of the present disclosure. It is to be understood that the described embodiments are only a few embodiments of the present disclosure, and not all embodiments. All other embodiments, which can be derived by a person skilled in the art from the described embodiments of the present disclosure without inventive labor, are within the protection scope of the present disclosure.

Unless defined otherwise, technical or scientific terms used herein shall have the ordinary meaning as understood by one of ordinary skill in the art to which this disclosure belongs. The use of "first", "second" and the like in this disclosure is not intended to indicate any order, quantity, or importance, but rather is used to distinguish one element from another. Also, the use of the terms "a", "an" or "the" and similar referents do not denote a limitation of quantity, but rather denote the presence of at least one. The word "comprising/including" or "comprises/includes", and the like, means that the element or item preceding the word comprises the element or item listed after the word and its equivalent, but does not exclude other elements or items. The terms "coupled" or "connected" and the like are not restricted to physical or mechanical connections, but may include electrical connections, whether direct or indirect. Terms "on", "under", "left", "right", and the like are used only to indicate relative positional relationships, and when the absolute position of the object being described is changed, the relative positional relationships may also be changed accordingly.

In the following description, when an element or layer is referred to as being "on" or "coupled to" another element or layer, it can be directly on, coupled to another element or layer, or intervening elements or layers may be present therebetween. However, when an element or layer is referred to as being "directly on" or "directly coupled to" another element or layer, there is no intervening element or layer present therebetwen. The term "and/or" includes any and all combinations of one or more of the associated listed items.

Although the terms first, second, etc. may be used herein to describe various elements, components, regions, layers and/or sections, these elements, components, regions, layers and/or sections should not be limited by these terms. These terms are used to distinguish one element, component, region, layer or section from another element, component, region, layer or section.

Figure 1:
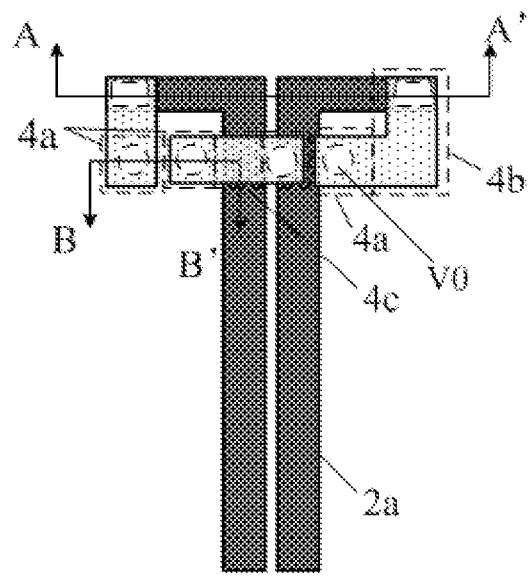
FIG. 1 is a partial plan view of a driving backplane in the related art.
Figure 2:
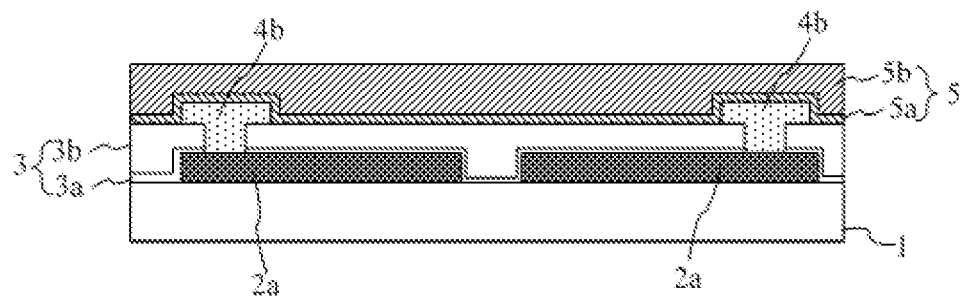
FIG. 2 is a cross-sectional view taken along line A-A' of FIG. 1.
Figure 3:
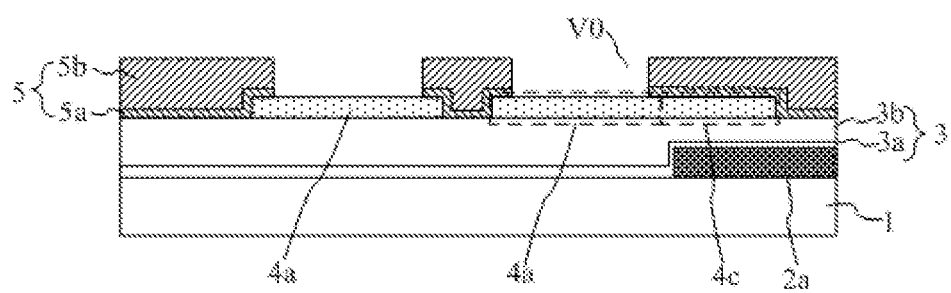
FIG. 3 is a cross-sectional view taken along line B-B' of FIG. 1.

FIG. 1 is a partial plan view of a driving backplane in the related art, FIG. 2 is a sectional view taken along line A-A' of FIG. 1, and FIG. 3 is a sectional view taken along line B-B' of FIG. 1, and with reference to FIGS. 1 to 3, the driving backplane includes: a base substrate 1, and a first conductive pattern, a first insulating layer 3, a second conductive pattern and a second insulating layer 5 arranged on the base substrate 1, where the first insulating layer 3 is arranged between the first conductive pattern and the second conductive pattern, and the second insulating layer 5 is arranged on a side, away from the base substrate 1, of the second conductive pattern. The first conductive pattern includes a plurality of signal lines 2a, and the second conductive layer includes a plurality of coupling electrodes 4a. The coupling electrodes 4a are used for coupling the light emitting device. The first conductive pattern further includes a plurality of binding electrodes, the binding electrodes are electrically coupled to a driving chip through a flexible circuit board, an end of the signal line 2a is coupled to one of the binding electrodes, and another end of the signal line 2a is coupled to one of the coupling electrodes 4a, so that a signal provided by the driving chip can be transmitted to the light emitting device. Illustratively, a plurality of light emitting devices may be divided into a plurality of groups, each group includes two light emitting devices coupled in series between a signal line transmitting a high level voltage and a signal line transmitting a low level voltage. The first conductive pattern further includes a plurality of first coupling lines 4b and a plurality of second coupling lines 4c, and among a pair of coupling electrodes 4a to which any one light emitting device 6 of the light emitting devices 6 is coupled, one of the coupling electrodes 4a is coupled to the signal line 2a through the first coupling line 4b, and the other coupling electrode 4a is coupled to the coupling electrode 4a, to which the adjacent light emitting device 6 in the same group as said any one light emitting device 6 is coupled, through the second coupling line 4c.

The first insulating layer 3 may include a first inorganic layer 3a and a first organic layer 3b, the second insulating layer 5 may include a second inorganic layer 5a and a second organic layer 5b, a thickness of the second inorganic layer 5a ranges from 1000 Å to 3000 Å, a thickness of the second organic layer 5b ranges from 2 μm to 5 μm, a via hole V0 is provided in the second insulating layer 5 to expose a portion of the coupling electrode 4a, thereby facilitating coupling of the electrode 6a of the light emitting device with the coupling electrode 4a through the via hole V0. The second insulating layer 5 covers spacing regions between the coupling electrodes 4a, thereby ensuring that the first organic layer 3b under the second conductive pattern is not damaged when the second inorganic layer 5a is etched.

Figure 4:
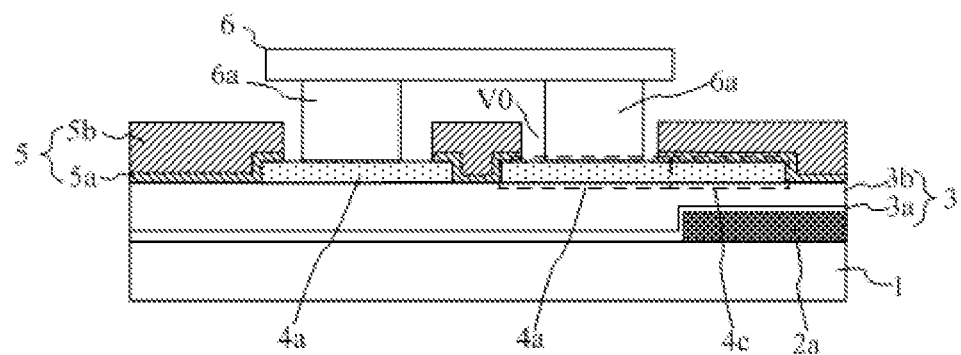
FIG. 4 is a schematic diagram illustrating that a light emitting device is normally coupled to a driving backplane.
Figure 5:
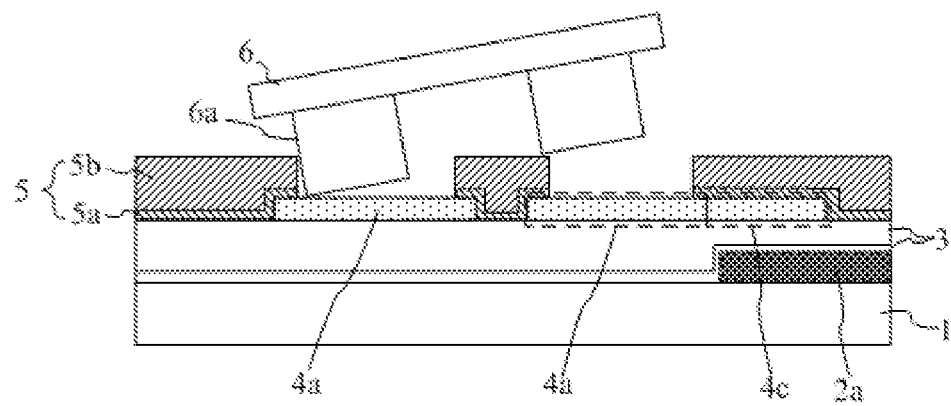
FIG. 5 is a schematic diagram of a light emitting device with a seesaw effect.

FIG. 4 is a schematic diagram illustrating that the light emitting device and the driving backplane are normally coupled, and FIG. 5 is a schematic diagram of the light emitting device when a seesaw effect occurs. As shown in FIG. 4, in the production process, the light emitting device 6 is generally transferred onto the driving backplane by using a transfer apparatus so that the electrode 6a of the light emitting device 6 is coupled to the coupling electrode 4a. Under the limitation of the die bonding deviation of the transfer apparatus, a position of the light emitting device 6 is likely to be deviated, for example, the die bonding deviation of the transfer apparatus is ±30 μm, a size of each of two electrodes 6a of the light emitting device 6 is 80 μm*80 μm, a size of the via hole V0 is 130 μm*130 μm, and an interval between the two electrodes 6a is 70 μm, in this case, since the second insulating layer 5 with a relative large thickness is provided at the interval between the coupling electrodes 4a, when the position of the light emitting device 6 is deviated, as shown in FIG. 5, one of the electrodes 6a of the light emitting device 6 is caused to overlap the second insulating layer 5, that is, a "seesaw effect" occurs, so that the electrode 6a of the light emitting device 6 cannot be electrically coupled to the coupling electrode 4a, and a die bonding failure occurs.

Figure 6:
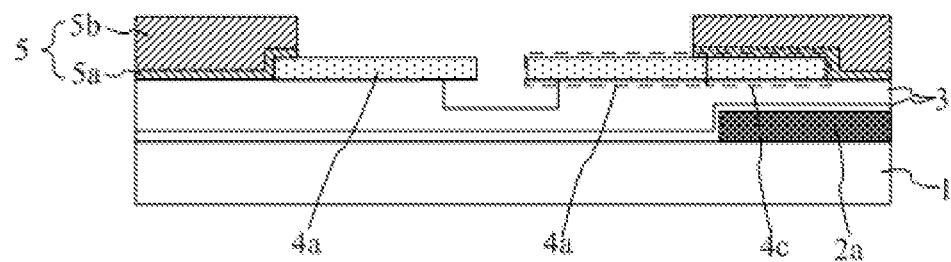
FIG. 6 is a diagram illustrating that thinning and lateral reduction occur in a first organic layer under a second conductive pattern in the related art.

In order to solve the die bonding deviation of the transfer apparatus, in some technologies, the interval between the two electrodes 6a of the light emitting device 6 may be reduced to meet the die bonding precision requirement, but when the interval between the two electrodes 6a of the light emitting device 6 is reduced to a certain range, a short circuit may easily occur inside the light emitting device, and for a future miniaturized light emitting device, the interval between the two electrodes is extremely small, and the die bonding deviation of the transfer apparatus cannot be compensated by reducing the interval between the two electrodes. In other techniques, the second insulating layer 5 at the interval between the coupling electrodes 4a is removed to improve the die bonding failure. That is, when the second inorganic layer 5b is formed, an entire layer of inorganic material is deposited first, and then the inorganic material in a first region, which is a region where the coupling electrode 4a is to be coupled to the electrode 6a of the light emitting device 6, and the inorganic material in a second region, which is a spacing region between two coupling electrodes 4a to which the same light emitting device 6 is coupled, is etched through a patterning process. In actual production, the inorganic material layer is over-etched to ensure that the inorganic material in the first region is completely etched off. However, when the over-etching is performed, the first organic layer 3b under the second conductive pattern is thinned and laterally reduced so that a stacked layer shape as shown in FIG. 6 is formed, thereby the coupling electrode 4a is easily peeled off when the light emitting device 6 is re-fixed (reworked).

Figure 7:
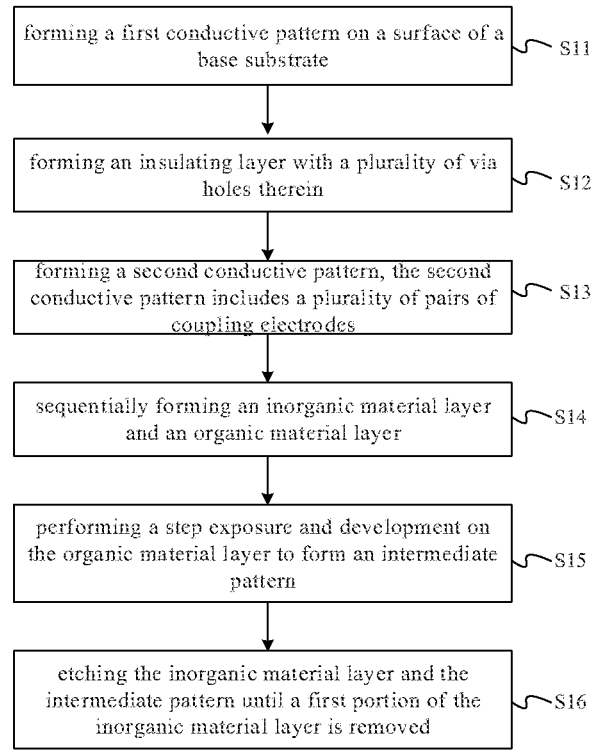
FIG. 7 is a flowchart of a method for manufacturing a driving backplane according to an embodiment of the present disclosure.
Figure 8A:
FIGS. 8A to 8H are schematic diagrams illustrating a process of manufacturing a driving backplane according to an embodiment of the present disclosure.
Figure 8B:
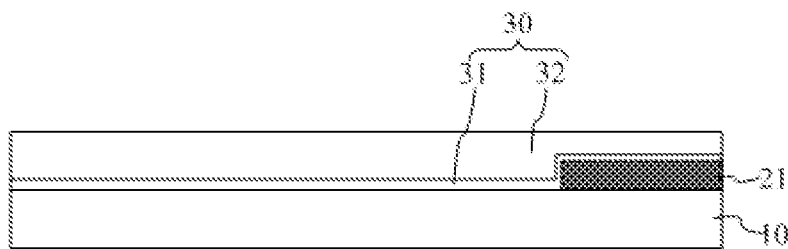
Figure 8C:
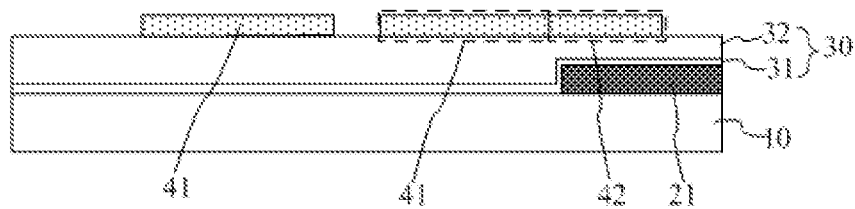
Figure 8D:
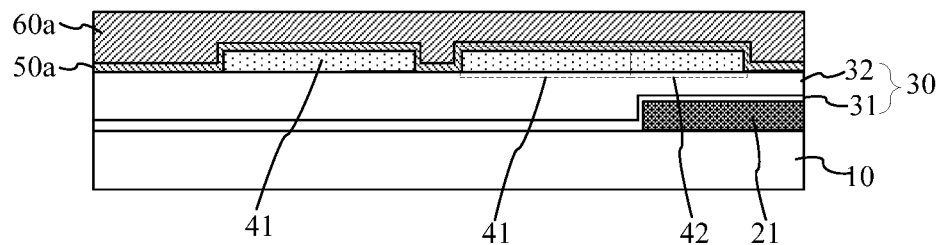
Figure 8E:
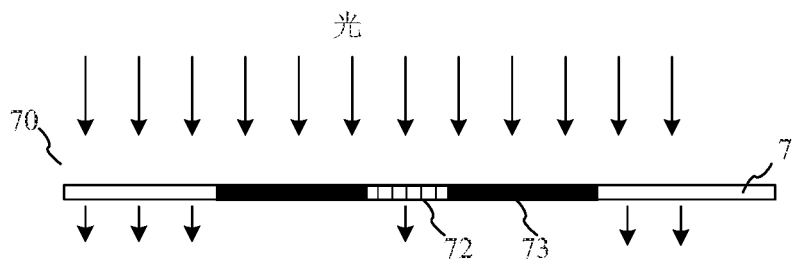
Figure 8E:
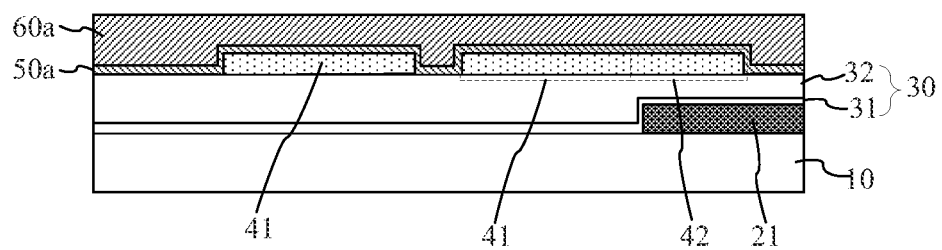
Figure 8F:
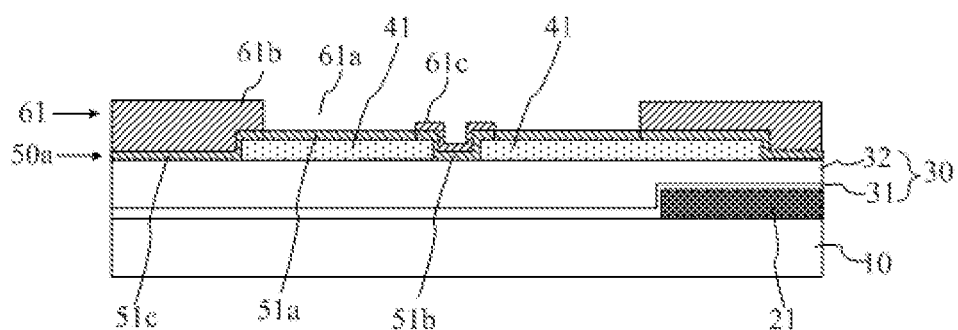
Figure 8G:
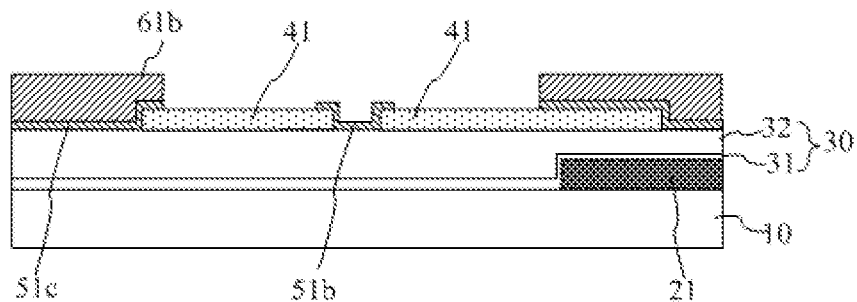
Figure 8H:
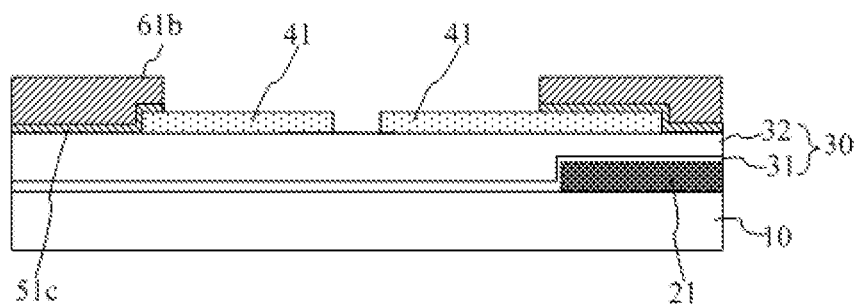

FIG. 7 is a flowchart of a method for manufacturing a driving backplane according to an embodiment of the present disclosure, and FIGS. 8A to 8H are schematic diagrams of a process for manufacturing a driving backplane according to an embodiment of the present disclosure, and as shown in FIGS. 7 to 8H, the method includes following steps S11 to S16.

In step S11, forming a first conductive pattern on the base substrate 10, as shown in FIG. 8A, the first conductive pattern includes a plurality of signal lines 21.

In some implementations, the base substrate 10 is a glass substrate or a flexible substrate, and the signal lines 21 may be made of copper or other material with good conductivity.

The step S11 may specifically include the following steps: S11a, forming a metal material layer on the base substrate 10, the metal material layer may be a copper metal layer, which may be formed by a single electroplating or multiple sputtering; S11b, coating a photoresist layer on the metal material layer; S11c, exposing and developing the photoresist so that the photoresist in a region where the signal lines 21 are to be formed remains and the photoresist in other regions is removed, during exposure, ultraviolet light may be used; S11d, etching the metal material layer to form the plurality of signal lines 21; and S11e, stripping off the residual photoresist.

In step S12, as shown in FIG. 8B, forming an insulating layer 30 having a plurality of via holes (not shown) therein.

In some implementations, the insulating layer 30 includes a first insulating sublayer 31 and a second insulating sublayer 32, the first insulating sublayer 31 being located between the second insulating sublayer 32 and the base substrate 10. The first insulating sublayer 31 is made of an inorganic material, which may be silicon nitride or silicon oxynitride. The second insulating sublayer 32 is made of an organic material, which may be a resin.

In some implementations, the step S12 specifically includes: sequentially forming a first inorganic material layer and a first organic material layer on the base substrate 10 on which the metal material layer is formed, where the first organic material layer may be a resin layer; then, exposing and developing the first organic material layer, so as to remove the organic material in the regions where via holes are to be formed, and retain the organic material in other regions, so as to form the second insulating sublayer 32; finally, etching the first inorganic material layer, thereby forming the first insulating sublayer 31 and the second insulating sublayer 32 having the via holes.

In step S13, as shown in FIG. 8C, forming a second conductive pattern on the base substrate on which the insulating layer 30 is formed, the second conductive pattern including a plurality of pairs of coupling electrodes 41; each pair of the coupling electrodes 41 is for respectively coupling two electrodes (i.e., a positive electrode and a negative electrode) of the light emitting device. In some implementations, the light emitting device employs a light emitting diode, for example, a Mini-LED or a Micro-LED. Each signal line 21 is coupled to at least one coupling electrode 41 through the via hole in the insulating layer 30.

For example, the connection manner of the coupling electrode 41 with the signal line 21 may be as shown in FIG. 1, that is, every two light emitting devices are in one group, and each group of light emitting devices are coupled in series between the signal line for transmitting a high level voltage and the signal line for transmitting a low level voltage. The second conductive pattern may further include: a plurality of first coupling lines (not shown) and a plurality of second coupling lines 42, among a pair of coupling electrodes 41 to which any one light emitting device of the light emitting devices is coupled, one of the coupling electrodes 41 is coupled to the signal line 21 through the first coupling line, and the other coupling electrode 41 is coupled to one of the coupling electrodes 41, to which the adjacent light emitting device in the same group as said any one light emitting device is coupled, through the second coupling line 42.

In step S14, as shown in FIG. 8D, sequentially forming a second inorganic material layer 50a and a second organic material layer 60a on the base substrate on which the second conductive pattern is formed. For example, the second inorganic material layer 50a may be a silicon nitride layer or a silicon oxynitride layer; the second organic material layer 60a is a resin layer doped with a photosensitive material.

In step S15, as shown in FIGS. 8E and 8F, performing a step exposure by using a mask plate 70 and then performing a development on the second organic material layer 60a to form an intermediate pattern 61. The intermediate pattern 61 includes a hollow-out portion 61a, a completely-reserved portion 61b, and a half-reserved portion 61c, and an orthographic projection of the half-reserved portion 61c on the base substrate 10 covers a spacing region between the pair of two coupling electrodes 41; an orthographic projection of the hollow-out portion 61a on the base substrate 10 covers at least a part of the coupling electrode 41; a thickness of the completely-reserved portion 61b is greater than a thickness of the half-reserved portion 61c, the thickness of the half-reserved portion 61c and a thickness of the second inorganic material layer 50a have a certain proportional relationship, and the proportional coefficient between the thickness of the half-reserved portion 61c and the thickness of the second inorganic material layer 50a is denoted as x, that is, the thickness of the half-reserved portion 61c is x times the thickness of the second inorganic material layer 50a.

It should be understood that the step exposure refers to an exposure using a half-tone mask plate or a gray-tone mask plate so that different regions of the second organic material layer 60a are exposed to different degrees. For example, the mask plate 70 includes a transmissive region 71, a half-transmissive region 72, and an opaque region 73, the half-transmissive region 72 has a light transmittance smaller than that of the transmissive region 71. Taking an example of doping a negative photosensitive material in the second organic material layer 60a, the half-transmissive region 72 corresponds to the spacing region between the pair of two coupling electrodes 41, the opaque region 73 corresponds to at least a portion of the coupling electrodes 41, and the transmissive region 71 corresponds to other regions, so that after the exposure and development are completed, the portion of the second organic material layer 60a corresponding to the opaque region 73 is completely removed to form the hollow-out portion 61a; a part of the portion of the second organic material layer 60a corresponding to the half-transmissive region 72 is removed to form the half-reserved portion 61c; the remaining portion of the second organic material layer 60a is left, forming the completely-reserved portion 61b.

Hereinafter, for convenience of description, a portion of the second inorganic material layer 50a corresponding to the hollow-out portion 61a is referred to as a first portion 51a of the second inorganic material layer 50a, a portion of the second inorganic material layer 50a corresponding to the half-reserved portion 61c is referred to as a second portion 51b of the second inorganic material layer 50a, and a portion of the second inorganic material layer 50a corresponding to the completely-reserved portion 61b is referred to as a third portion 51c of the second inorganic material layer 50a.

In step S16, as shown in FIG. 8G, etching the second inorganic material layer 50a and the intermediate pattern 61 until the first portion 51a of the second inorganic material layer 50a is removed. During the etching process, the etching selection ratio of the second inorganic material layer 50a to the intermediate pattern 61 is 1:y, and x is greater than 0 and less than or equal to y. Therefore, when the first portion 51a of the second inorganic material layer 50a is completely etched off, the half-reserved portion 61c has been completely etched off.

In some implementations, the second inorganic material layer 50a and the intermediate pattern 61 may be etched by dry etching in step S16.

In an embodiment of the present disclosure, when the first portion 51a of the second inorganic material layer 50a is removed, the half-reserved portion 61c formed at the spacing region between the coupling electrodes 41 is also removed, and thus, no thick insulating layer is formed over the spacing region between the coupling electrodes 41, thereby reducing die bonding failure when fixing the light emitting device. In addition, in the method in this embodiment, no additional process step is required, and in addition, after etching, the second portion 51b of the second inorganic material layer 50a remains at the spacing region between the coupling electrodes 41, so that the first insulating layer 30 is prevented from being affected by etching, and compared with the structure shown in FIG. 6, the driving backplane manufactured in the embodiment of the present disclosure can prevent the coupling electrodes 41 from peeling off when the light emitting device is reworked or re-fixed.

In some implementations, $0.75 \leq x \leq 0.9$, $3 \leq y \leq 5$, so that when the first portion 51a of the second inorganic material layer 50a is completely etched off, the half-reserved portion 61c of the intermediate pattern 61 has been completely etched off, and the remaining thickness of the second portion 51b of the second inorganic material layer 50a is relative thin. For example, x is 0.8 and y is 4.

Exemplarily, an initial thickness of the second inorganic material layer 50a formed in step S14 is 1000 Å, an initial thickness of the half-reserved portion 61c of the intermediate pattern 61 formed in step S15 is 800 Å, the etching selection ratio of the second inorganic material layer 50a to the intermediate pattern 61 is 1:4, in such case, when the first portion 51a of the second inorganic material layer 50a is completely etched off, the half-reserved portion 61c of the intermediate pattern 61 is also completely etched off, the second portion 51b of the second inorganic material layer 50a is etched away by a thickness of 800 Å, and the remaining thickness of the second portions 51b is 200 Å.

In some implementations, after step S16, the method further includes a step S17: as shown in FIG. 8H, etching the second inorganic material (i.e., the reserved part of the second portion 51b of the second inorganic material layer 50 a) reserved in the area where the half-reserved portion 61c is located, so that the second portion 51b of the second inorganic material layer 50a is further thinned or completely removed, thereby further reducing the seesaw effect.

In the step S17, a dry etching method is also used, and etching parameters except the etching time may be the same as those in step S16. Assuming that the etching time of step S17 is t1 and the etching time of step S16 is t2, the time required for the half-reserved portion 61c to be completely etched off is $t2*x/y$. In some implementations, $0.8*t2*x/y \leq t1 \leq 1.1*t2*x/y$, so that the second portion 51b of the second inorganic material layer 50a may be removed as much as possible, and the second insulating sublayer 32 is prevented from being affected. For example, $t1=t2*x/y$.

When etching is performed in step S16 and step S17, the thickness of the completely-reserved portion 61b of the intermediate pattern 61 is reduced, in order to ensure that the completely-reserved portion 61b of the intermediate pattern 61 still has a certain thickness after the step S17, in some implementations, the initial thickness of the completely-reserved portion 61b (i.e., the thickness of the second organic material layer 60a formed in step S14) is 15 to 60 times the initial thickness of the second inorganic material layer 50a. For example, the second inorganic material layer 50a has an initial thickness of 1000 Å to 2000 Å, the completely-reserved portion 61b has an initial thickness ranging from 1.5 µm to 5 µm, and the half-reserved portion 61c has an initial thickness of 800 Å to 1600 Å.

In some implementations, before step S11, a buffer layer may be formed on the base substrate 10 first to increase the adhesion of the first conductive pattern on the base substrate 10.

It should be noted that, the above embodiment is explained by taking the light emitting devices coupled to the driving backplane are divided into multiple groups, and two light emitting devices in each group are coupled in series between two signal lines as an example. It should be understood that the light emitting devices may be coupled in other ways, which are not limited in detail herein. For example, each group includes four light emitting devices, and two of the four light emitting devices are coupled in series, and another two of the four light emitting devices are coupled in series, and then the two light emitting devices coupled in series and the another two light emitting devices coupled in series are coupled in parallel between two signal lines. For another example, in the light emitting devices coupled to the driving backplane, each light emitting device is correspondingly coupled to two signal lines, one of the two signal lines is coupled to the first electrode of the light emitting device, and the other of the two signal lines is coupled to a pixel driving chip or a pixel driving circuit, and the pixel driving chip or the pixel driving circuit is configured to provide a driving signal for the light emitting device, thereby an active driving is implemented.

Figure 9:
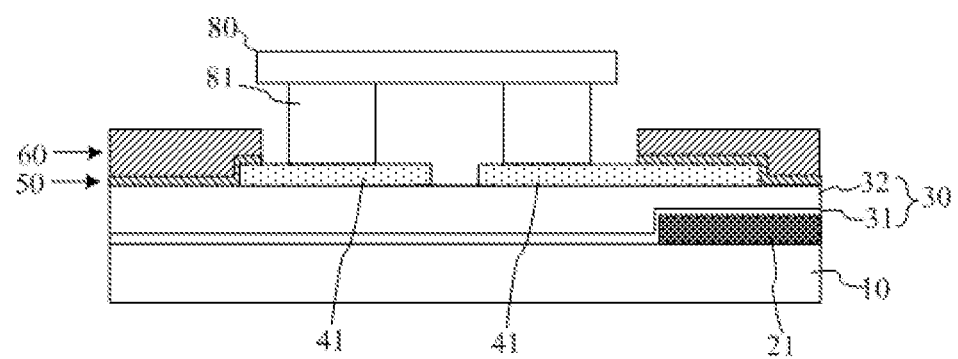
FIG. 9 is a schematic diagram of a driving backplane and a light emitting device provided by an embodiment of the present disclosure.

An embodiment of the present disclosure further provides a driving backplane manufactured by the above method, where the driving backplane can be used in a display panel to drive the light emitting device of the display panel to emit light; the driving backplane can also be used in a backlight module to drive the light emitting device in the backlight module to emit light. FIG. 9 is a schematic diagram of a driving backplane and a light emitting device according to an embodiment of the present disclosure, and as shown in FIG. 9, the driving backplane includes: a base substrate 10, and a first conductive pattern, an insulating layer 30, a second conductive pattern, an inorganic layer 50, and an organic layer 60 disposed on the base substrate 10. The first conductive pattern includes a plurality of signal lines 21. The insulating layer 30 is disposed on a side of the first conductive pattern away from the base substrate 10 and on a surface of the base substrate on which the first conductive pattern is disposed, and the insulating layer 30 has a plurality of via holes therein. The second conductive pattern is located on a surface of the insulating layer away from the base substrate 10 and includes a plurality of pairs of coupling electrodes 41, and each signal line 21 is coupled to at least one of the coupling electrodes 41 through the via hole in the insulating layer 30; the coupling electrodes 41 in each pair are used to couple to two electrodes 81 of the light emitting device 80, respectively. The inorganic layer 50 is disposed on a portion of a surface of the second conductive pattern away from the base substrate 10 and a portion of a surface of the insulating layer away from the base substrate 10, and the organic layer 60 is disposed on a surface of the inorganic layer 50 away from the base substrate 10. Both the inorganic layer 50 and the organic layer 60 expose at least a portion of the coupling electrode 41, and an orthographic projection of the organic layer 60 on the base substrate 10 does not overlap a spacing region between the pair of two coupling electrodes 41.

Further, the inorganic layer 50 exposes the spacing region between the pair of two coupling electrodes 41.

In some implementations, the insulating layer 30 includes a first insulating sublayer 31 and a second insulating sublayer 32, the first insulating sublayer 31 is located between the second insulating sublayer 32 and the base substrate 10, the first insulating sublayer 31 is made of an inorganic material, which may be silicon nitride or silicon oxynitride, and the second insulating sublayer 32 is made of an organic material, which may be photoresist.

An embodiment of the present disclosure further provides a display device, as shown in FIG. 9, the display device includes: the above-mentioned driving backplane and a plurality of light emitting devices 80, two electrodes 81 of each of the light emitting devices 80 are coupled to the two coupling electrodes 41 in a pair, respectively.

In some implementations, the display device may be any product or component with a display function, such as a liquid crystal panel, electronic paper, a mobile phone, a tablet personal computer, a television, a display, a notebook computer, a digital photo frame, a navigator and the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A method for manufacturing a driving backplane, comprising:
    forming a first conductive pattern on a surface of a base substrate, the first conductive pattern comprises a plurality of signal lines;
    forming an insulating layer with a plurality of via holes therein on the base substrate on which the first conductive pattern is formed;
    forming a second conductive pattern on the base substrate on which the insulating layer is formed, the second conductive pattern comprises a plurality of pairs of coupling electrodes, each pair of coupling electrodes being respectively used for coupling two electrodes of a light emitting device; each signal line is coupled to at least one coupling electrode of the pair of coupling electrodes through one of the via holes in the insulating layer;
    sequentially forming an inorganic material layer and an organic material layer on the base substrate on which the second conductive pattern is formed;
    performing a step exposure and development on the organic material layer to form an intermediate pattern; the intermediate pattern comprises a hollow-out portion, a completely-reserved portion and a half-reserved portion, and an orthographic projection of the half-reserved portion on the base substrate covers a spacing region between each pair of coupling electrodes; an orthographic projection of the hollow-out portion on the base substrate covers at least a part of one coupling electrode of each pair of coupling electrodes below the hollow-out portion; a thickness of the completely-reserved portion is greater than that of the half-reserved portion, and a thickness of the half-reserved portion is x times a thickness of the inorganic material layer;

etching the inorganic material layer and the intermediate pattern until a portion of the inorganic material layer, corresponding to an area where the hollow-out portion is located, is removed; during the etching, an etching selection ratio of the inorganic material layer to the intermediate pattern is 1:y, wherein $0<x\leq y$.

2. The method of claim 1, wherein $0.7\leq x\leq 0.9$, and $3\leq y\leq 5$.

3. The method of claim 2, wherein an initial thickness of the completely-reserved portion is 15 to 60 times an initial thickness of the inorganic material layer.

4. The method of claim 2, wherein a dry etching method is used for etching the inorganic material layer and the intermediate pattern.

5. The method of claim 2, wherein the insulating layer comprises a first insulating sublayer and a second insulating sublayer, the first insulating sublayer is located between the second insulating sublayer and the base substrate and the first conductive pattern, the first insulating sublayer is made of an inorganic material, and the second insulating sublayer is made of an organic material.

6. The method of claim 1, further comprising:

during the etching the inorganic material layer and the intermediate pattern, etching the inorganic material layer reserved in a region where the half-reserved portion is located to remove the inorganic material layer reserved.

7. The method of claim 6, wherein an etching time for etching the portion of the inorganic material layer reserved in the region where the half-reserved portion is located is t1, and an etching time for etching the inorganic material layer and the intermediate pattern is t2, wherein $0.8*t2*x/y \leq t1 \leq 1.1*t2*x/y$.

8. The method of claim 7, wherein an initial thickness of the completely-reserved portion is 15 to 60 times an initial thickness of the inorganic material layer.

9. The method of claim 7, wherein a dry etching method is used for etching the inorganic material layer and the intermediate pattern.

10. The method of claim 7, wherein the insulating layer comprises a first insulating sublayer and a second insulating sublayer, the first insulating sublayer is located between the second insulating sublayer and the base substrate and the first conductive pattern, the first insulating sublayer is made of an inorganic material, and the second insulating sublayer is made of an organic material.

11. The method of claim 6, wherein an initial thickness of the completely-reserved portion is 15 to 60 times an initial thickness of the inorganic material layer.

12. The method of claim 6, wherein a dry etching method is used for etching the inorganic material layer and the intermediate pattern.

13. The method according to claim 6, wherein the insulating layer includes a first insulating sublayer and a second insulating sublayer, the first insulating sublayer is located between the second insulating sublayer and the substrate and the first conductive pattern, the first insulating sublayer is made of an inorganic material, and the second insulating sublayer is made of an organic material.

14. The method of claim 1, wherein an initial thickness of the completely-reserved portion is 15 to 60 times an initial thickness of the inorganic material layer.

15. The method of claim 1, wherein a dry etching method is used for etching the inorganic material layer and the intermediate pattern.

16. The method of claim 1, wherein the insulating layer comprises a first insulating sublayer and a second insulating sublayer, the first insulating sublayer is located between the second insulating sublayer and the base substrate and the first conductive pattern, the first insulating sublayer is made of an inorganic material, and the second insulating sublayer is made of an organic material.

* * * * *

UNITED STATES PATENT AND TRADEMARK OFFICE
CERTIFICATE OF CORRECTION

| | | |
|---|---|---|
| PATENT NO. | : 11,817,463 B2 | Page 1 of 1 |
| APPLICATION NO. | : 17/213939 | |
| DATED | : November 14, 2023 | |
| INVENTOR(S) | : Wenjie Xu et al. | |

It is certified that error appears in the above-identified patent and that said Letters Patent is hereby corrected as shown below:

On the Title Page

Item (73), please remove Assignee 2 "BOE TECHNOLOGY.GROUP CO., LTD.," and replace with "BOE TECHNOLOGY GROUP CO., LTD.".

Signed and Sealed this
Nineteenth Day of March, 2024

Katherine Kelly Vidal
*Director of the United States Patent and Trademark Office*